United States Patent [19]
Oguri

[11] Patent Number: 5,254,887
[45] Date of Patent: Oct. 19, 1993

[54] ECL TO BICMIS LEVEL CONVERTER

[75] Inventor: Takashi Oguri, Tokyo, Japan

[73] Assignee: NEC Corporation, Tokyo, Japan

[21] Appl. No.: 900,421

[22] Filed: Jun. 18, 1992

[30] Foreign Application Priority Data

Jun. 27, 1991 [JP] Japan .................................. 3-155040
Jul. 22, 1991 [JP] Japan .................................. 3-180651

[51] Int. Cl.$^5$ .......................................... H03K 19/092
[52] U.S. Cl. ..................................... 307/475; 307/446
[58] Field of Search ............... 307/443, 446, 451, 455, 307/475, 570

[56] References Cited

U.S. PATENT DOCUMENTS

| | | | |
|---|---|---|---|
| 4,906,871 | 3/1990 | Iida | 302/475 |
| 5,027,323 | 6/1991 | Miyamoto et al. | 307/446 X |
| 5,070,261 | 12/1991 | Ten Eyck | 307/475 |
| 5,075,579 | 12/1991 | Ueno | 307/446 X |
| 5,101,125 | 3/1992 | Hara et al. | 307/475 |
| 5,124,581 | 6/1992 | Imeki | 307/455 X |
| 5,132,573 | 7/1992 | Tsuru et al. | 307/446 X |
| 5,162,677 | 11/1992 | Takahashi | 307/455 X |

Primary Examiner—David R. Hudspeth
Attorney, Agent, or Firm—Laff, Whitesel, Conte & Saret

[57] ABSTRACT

A level converter is of a three-stage circuit arrangement composed of an ECL circuit, a pair of emitter followers and a pair of level converting circuits. Each level converting circuit converts the logic level of an output signal from the ECL circuit into the logic level of a MIS or BiMIS output signal. Each level converting circuit has an input stage comprising an inverter composed of a P-type MIS transistor and an N-type MIS transistor, whose gates are supplied with the input signal, to be converted in level, from the ECL circuit. The small amplitude of the supplied input signal is fully swung to completely turn on or turn off a bipolar transistor in the output stage of the level converting circuit, thereby producing an output signal of MIS or BiMIS logic level. Each level converting circuit also has a discharge circuit to quickly drain input and output stage signals and an MIS transistor or bipolar transistor, to shorten the time delay which the input signal suffers when transmitted through the level converter. The discharge circuit and the MIS transistor or bipolar transistor also effectively reduce the steady current flowing through the level converting circuit.

8 Claims, 5 Drawing Sheets

ECL TO BICMIS LEVEL CONVERTER

BACKGROUND OF THE INVENTION

1. Field of the Invention

The present invention relates to a level converter, and more particularly to a level converter for converting an input signal of the ECL rating logic level into an output signal of the MIS or BiMIS rating logic level.

2. Description of the Prior Art

Figure 1:
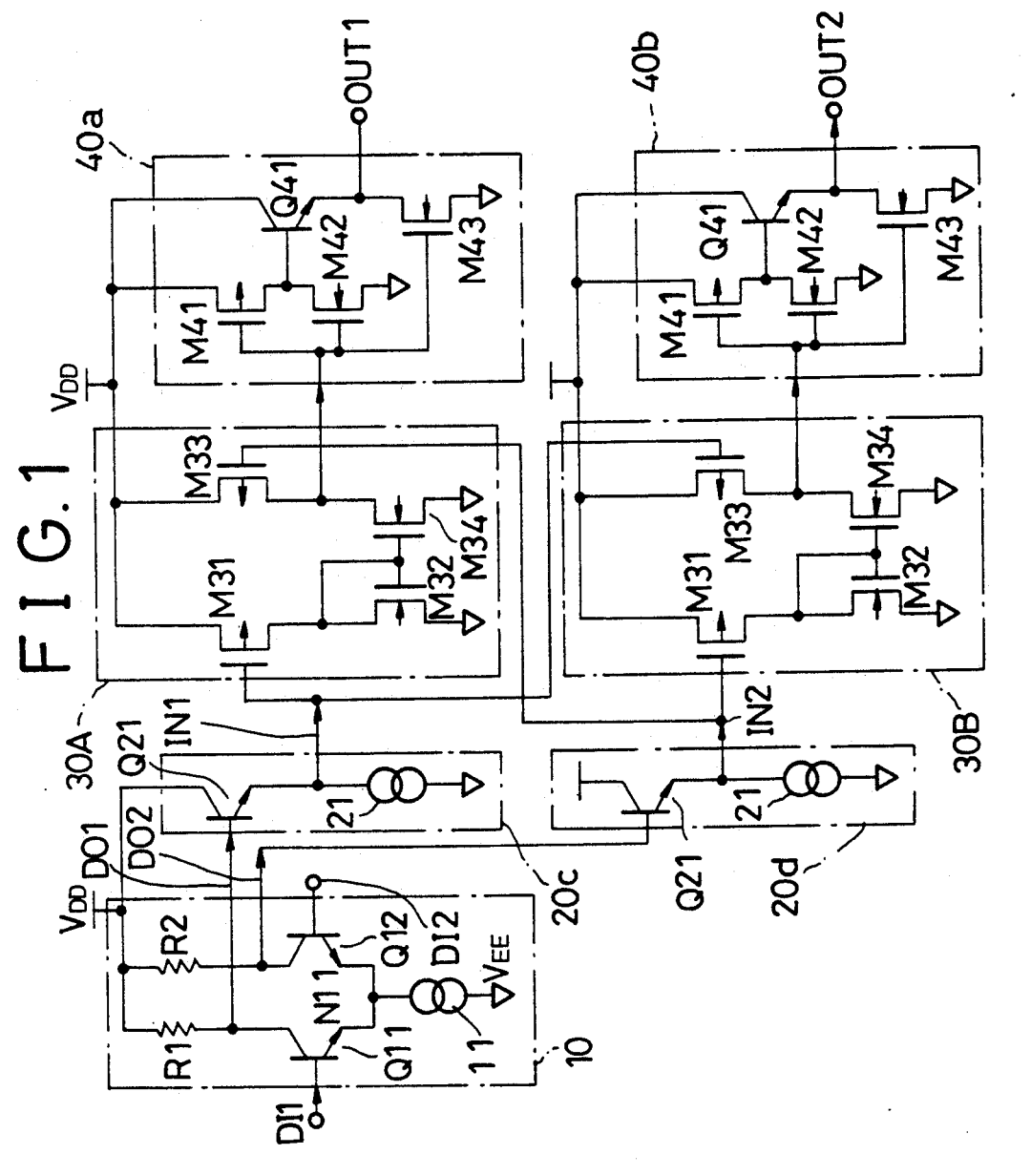

FIG. 1 of the accompanying drawings shows a conventional level converter.

As shown in FIG. 1, the conventional level converter has ECL circuit 10 comprising a pair of bipolar transistors Q11, Q12 whose emitters are coupled to each other, load resistors R1, R2 connected to respective bipolar transistors Q11, Q12, and constant-current supply 11. When data D11, D12 are supplied respectively to the bases of bipolar transistors Q11, Q12, the collectors thereof output respective data D01, D02 of the ECL logic level.

The level converter also has a pair of emitter followers 20c, 20d each having bipolar transistor Q21 and constant-current supply 21. When data D01, D02 are supplied to the respective bases of bipolar transistors Q21 of emitter followers 20c, 20d, they output respective signals IN1, IN2.

The level converter also includes a pair of level converting circuits 30A, 30B each having a pair of P-type MIS transistors M31, M33 and a pair of N-type MIS transistors M32, M34. When signals IN1, IN2 are supplied to level converting circuits 30A, 30B, they convert supplied signals IN1, IN2 into respective MIS or BiMIS logic level signals.

The level converter further has a pair of drivers 40a, 40b each having P-type MIS transistor M41, N-type MIS transistors M42, M43 and bipolar transistor Q41. When drivers 40a, 40b are supplied with the respective signals from level converting circuits 30A, 30B, drivers 40a, 40b produce output signals OUT1, OUT2, respectively, to drive a logic circuit (not shown).

The output signals from level converting circuits 30A, 30B are of the MIS or BiMIS logic level, as described above. Each of level converting circuits 30A, 30b has an output stage composed of MIS transistors M33, M34. If a large load is directly driven by these MIS transistors, then the signals from the transistors are transmitted with a large time delay. Therefore, BiMIS drivers 40a, 40b are connected to the output terminals of level converting circuits 30A, 30B for driving the load. In this case, constant currents flow through level converting circuits 30A, 30B.

Since the output stage of each of level converting circuits 30A, 30B is composed of MIS transistors M33, M34 and also since BiMIS drivers 40a, 40b are required to drive a large load, as described above, the time delay which the input signals undergo is still large. In addition, the steady currents flowing through level converting circuits 30A, 30B result in a large current consumption.

FIG. 2 of the accompanying drawings illustrates a modified circuit of the conventional level converting circuits 30A, 30B. Reference voltage $V_{REF}$ is applied to the gate of P-type MIS transistor M33 so that MIS transistor M33 is turned off when the input signal applied thereto is low. With the circuit arrangement shown in FIG. 2, while the time delay that the input signal suffers is small, a large current flows through the level converting circuit depending on reference voltage $V_{REF}$ and because of current-mirror N-type MIS transistor M32, with a resulting large power consumption. Since the level converting circuit shown in FIG. 2 is also low in driving capability, it is necessary to add a driver for higher driving capability if a large load is coupled thereto.

SUMMARY OF THE INVENTION

It is an object of the present invention to provide a level converter which is capable of shortening the time delay that an input signal undergoes and which has a relatively low current requirement.

To achieve the above object, there is provided in accordance with the present invention a level converting circuit which comprises an NPN first bipolar transistor having a collector connected to a power supply and an emitter connected to an output terminal of the level converter, an N-type first MIS transistor having a drain connected to the output terminal and a source connected to a reference potential supply, a P-type second MIS transistor having a source connected to the power supply, a drain connected to the base of the first bipolar transistor, and a gate connected to an input terminal supplied with an input signal from the emitter follower, a P-type third MIS transistor having a source connected to the gate of the second MIS transistor, a drain connected to the gate of the first MIS transistor, and a gate connected to a terminal supplied with a control potential supply, an N-type fourth MIS transistor having a source connected to the reference potential supply, a drain connected to the base of the first bipolar transistor, and a gate connected to the drain of the third MIS transistor, and a discharge circuit having a first terminal connected to the gate of the first MIS transistor and a second terminal connected to the reference potential supply.

The discharge circuit may comprise a resistor having a predetermined resistance, or a fifth MIS transistor having a drain connected to the gate of the first MIS transistor, a gate connected to the base of the first bipolar transistor, and a source connected to the reference potential supply.

The level converting circuit may include, in place of the first MIS transistor, an NPN second bipolar transistor having a collector connected to the output terminal, an emitter connected to the reference potential supply, and a base connected to the drain of the third MIS transistor and to the first terminal of the discharge circuit, or alternatively may include, in place of the third MIS transistor, a diode having an anode connected to the gates of the second and fourth MIS transistors and a cathode connected to the gate of the first MIS transistor and to the first terminal of the discharge circuit.

According to the present invention, there is also provided a level converter comprising an ECL circuit having two output terminals, a pair of emitter followers each connected to one of said output terminals, and a pair of level converting circuits each connected to one of said emitter followers, for converting the complementary logic levels of output signals from the ECL circuit into the logic levels of the MIS or BiMIS output signals, respectively. Each of the emitter followers comprises an NPN bipolar transistor having a collector connected to the power supply, a base connected to one of the output terminals of the ECL circuit, and an emitter connected to one of the level converting circuits, a diode having an anode connected to the emitter of the NPN bipolar transistor, and a constant-current supply connected between the cathode of the diode and a reference potential supply. Each of the level converting circuits comprises an NPN first bipolar transistor having a collector connected to the power supply and an emitter connected to an output terminal of the level converter, an N-type first MIS transistor having a drain connected to the output terminal and a source connected to the reference potential supply, a P-type second MIS transistor having a source connected to the power supply, a drain connected to the base of the first bipolar transistor, and a gate connected to an input terminal supplied with an input signal from the emitter follower, a P-type third MIS transistor having a source connected to the gate of the second MIS transistor, a drain connected to the gate of the first MIS transistor, and a gate connected to a terminal supplied with a control potential supply, an N-type fourth MIS transistor having a source connected to the reference potential supply, a drain connected to the base of the first bipolar transistor, and a gate connected to the drain of the third MIS transistor, and an N-type fifth MIS transistor having a drain connected to the gate of the first MIS transistor, a gate connected to the cathode of the diode of the other emitter follower which is not connected to either level converting circuit, and a source connected to the reference potential supply.

The level converting circuit described above may also include, in place of the first MIS transistor, the NPN second bipolar transistor described above in the first level converting circuit.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a circuit diagram of a conventional level converter;

DETAILED DESCRIPTION OF THE PREFERRED EMBODIMENTS

Figure 2:
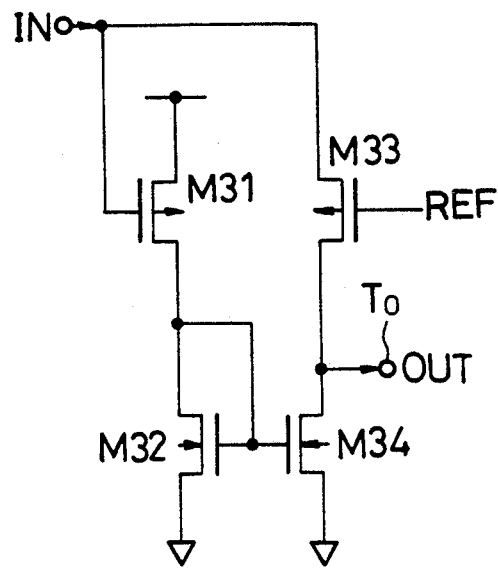
FIG. 2 is a circuit diagram of a modification of the level converting circuits of the conventional level converter shown in FIG. 1.

The same or corresponding reference characters denote the same or corresponding parts throughout views.

Figure 3:
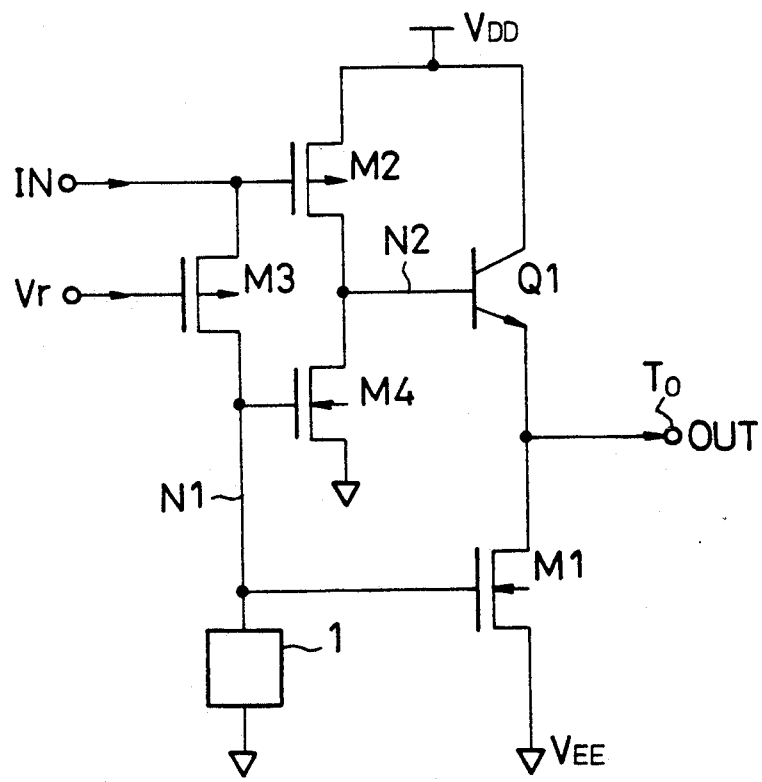
FIG. 3 is a circuit diagram of a first embodiment of a level converting circuit for use in a level converter according to the present invention.

As shown in FIG. 3, the level converting circuit comprises NPN first bipolar transistor Q1 having a collector connected to power supply $V_{DD}$ and an emitter connected to an output terminal To, N-type first MIS transistor M1 having a drain connected to output terminal To and a source connected to reference potential supply $V_{EE}$, P-type second MIS transistor M2 having a source connected to power supply VDD, a drain connected to the base of first bipolar transistor Q1, and a gate connected to an input terminal supplied with input signal IN, P-type third MIS transistor M3 having a source connected to the gate of second MIS transistor M2, a drain connected to the gate of first MIS transistor M1, and a gate connected to a terminal supplied with control potential Vr, N-type fourth MIS transistor M4 having a source connected to reference potential supply $V_{EE}$, a drain connected to the base of first bipolar transistor Q1, and a gate connected to the drain of third MIS transistor M3, and discharge circuit 1 in the form of a resistor of a predetermined resistance, having one terminal connected to the gate of first MIS transistor M1 and the other terminal connected to reference potential supply $V_{EE}$.

The level converting circuit shown in FIG. 3 operates as follows:

Input signal IN corresponds to either input signal IN1 or IN2 from emitter followers 20c, 20d of the conventional level converter shown in FIG. 1.

In ECL circuit 10 shown in FIG. 1, the voltage amplitudes of output data D01, D02 can be set to desired levels depending on resistors R1, R2 and the magnitude of a current from constant-current supply 11. Depending on the components of constant-current supply 11, a certain voltage is required to be applied across the constant-current supply 11, with a lower limit being present for the potential at node N11. In order for bipolar transistors Q11, Q12 not to be saturated at all times, there is a lower limit for the potentials of output data D01, D02. If it is assumed that power supply potential $V_{DD}$ is 0V and that reference potential $V_{EE}$ is $-4.5V$, then the voltage amplitudes of the output data from ECL circuit 10 are approximately 2.0V at maximum. Output signals IN1, IN2 from emitter followers 20c, 20d have a potential ranging from $-0.8$ to $-2.8$ V. Input signal IN of this potential is applied to the level converting circuit shown in FIG. 3. Reference potential Vr is so selected that MIS transistor M3 is turned off when input signal IN is of a low level ($-2.8V$ in the illustrated embodiment).

When input signal IN is low in level, MIS transistor M3 is turned off, and the potential at node N1 is lowered to reference potential $V_{EE}$ by the discharge circuit 1. As a result, MIS transistors M1, M4 are turned off. MIS transistor M2 is turned on, and the potential at node N2 rises to power supply potential $V_{DD}$. Consequently, bipolar transistor Q1 is turned on, and output signal OUT at output terminal To increases to power supply potential $V_{DD}$.

When input signal IN is high in level, MIS transistor M3 is turned on, and the potential at node N1 is increased to the high level of input signal IN. As a result, MIS transistors M1, M4 are turned on. MIS transistor M2 is turned off, and the potential at node N2 drops to reference potential $V_{EE}$. Consequently, bipolar transistor Q1 is turned off, and output signal OUT at output terminal To falls to reference potential $V_{EE}$.

Since nodes N1, N2 may be of the MIS or BiMIS logic level, the steady current flowing through the level converting circuit may be reduced substantially to "0" to allow the transistors to be switched. The time delay that the signal applied to the level converter undergoes is shortened because it comprises three transistor stages, whereas the conventional level converter comprises four transistor stages including the ECL circuit, the emitter followers, the level converting circuits, and the drivers.

Figure 4:
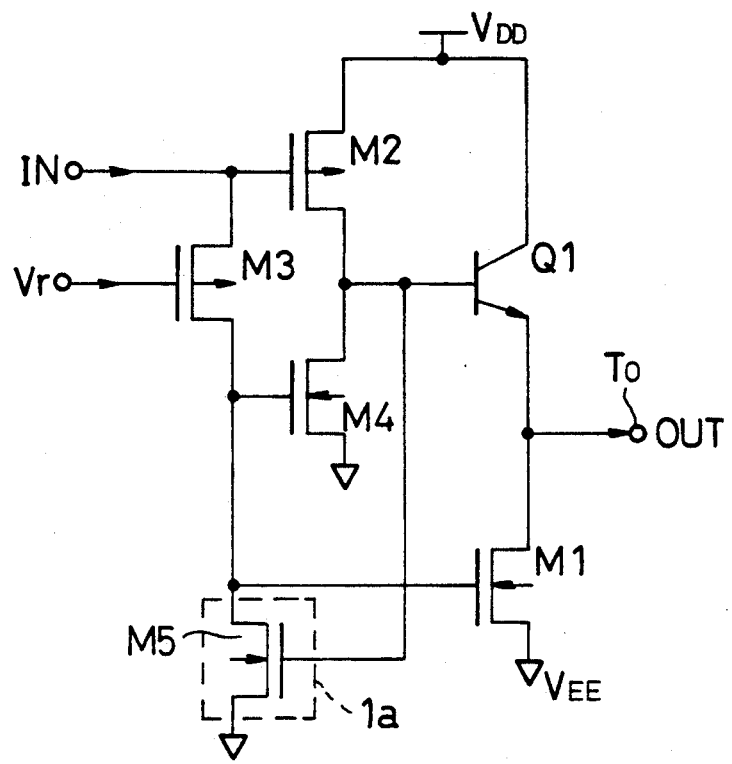
FIG. 4 is a circuit diagram of a second embodiment of a level converting circuit.

The level converting circuit shown in FIG. 4 differs from the level converting circuit shown in FIG. 3 in that discharge circuit 1 shown in FIG. 3 is replaced by discharge circuit 1a comprising fifth MIS transistor M5 having a drain connected to the gate of first MIS transistor M1, a gate connected to the base of first bipolar transistor Q1, and a source connected to reference potential supply $V_{EE}$. Since the gate of fifth MIS transistor M5 is joined to node N2, it discharges only when MIS transistor M3 is turned off, and the steady current flowing through discharge circuit 1a is reduced to "0".

Figure 5:
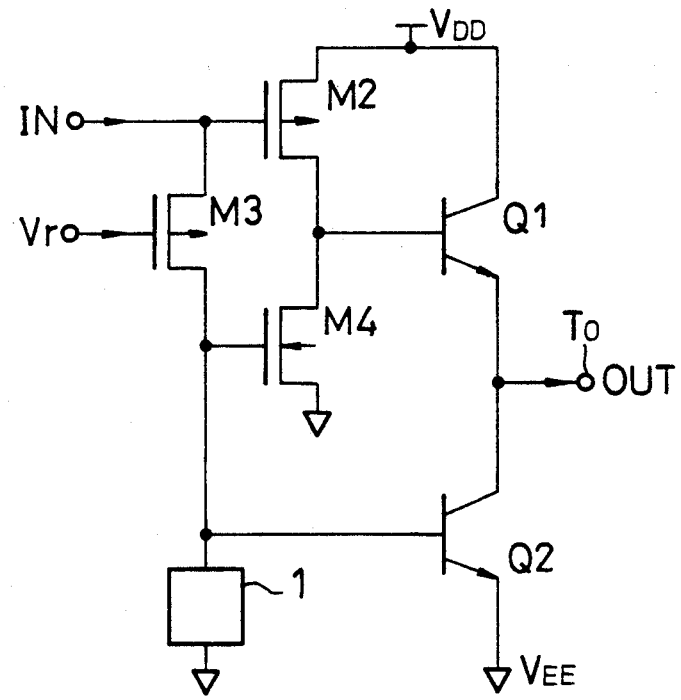
FIG. 5 is a circuit diagram of a third embodiment of a level converting circuit.

The level converting circuit shown in FIG. 5 differs from the level converting circuit shown in FIG. 3 in that first MIS transistor M1 shown in FIG. 3 is replaced by second bipolar transistor Q2 having a collector connected to output terminal To, an emitter connected to reference potential supply $V_{EE}$, and a base connected to the gate of fourth MIS transistor M4. Inasmuch as bipolar transistor Q2 is used to drain the load connected to the output terminal To, the time delay which output signal OUT suffers when it decays can be reduced even if the load is relatively large.

Figure 6:
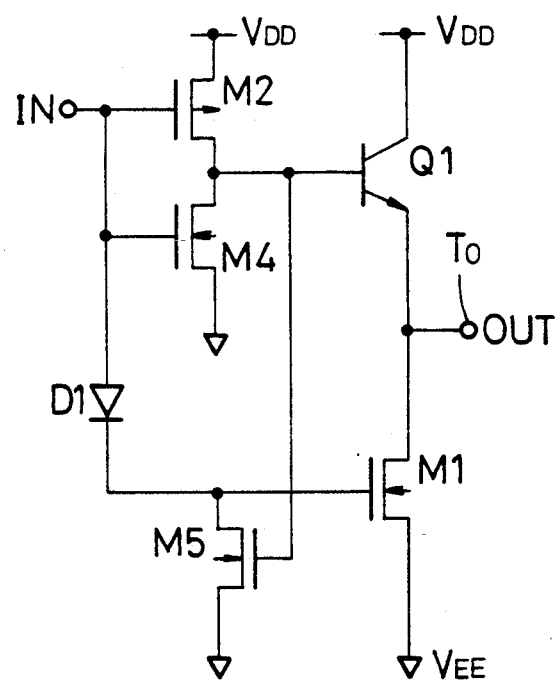
FIG. 6 is a circuit diagram of a fourth embodiment of a level converting circuit.

The level converting circuit shown in FIG. 6 differs from the level converting circuit shown in FIG. 4 in that third MIS transistor M3 shown in FIG. 4 is replaced by diode D1 having an anode connected to the gates of second and fourth MIS transistors M2, M4 and a cathode connected to the gate of first MIS transistor M1 and to the drain of fifth MIS transistor M5. Diode D1 serves to shift input signal IN in level to make the low level thereof lower than the threshold voltage for first MIS transistor M1, so that first MIS transistor M1 can reliably be turned off.

Figure 7:
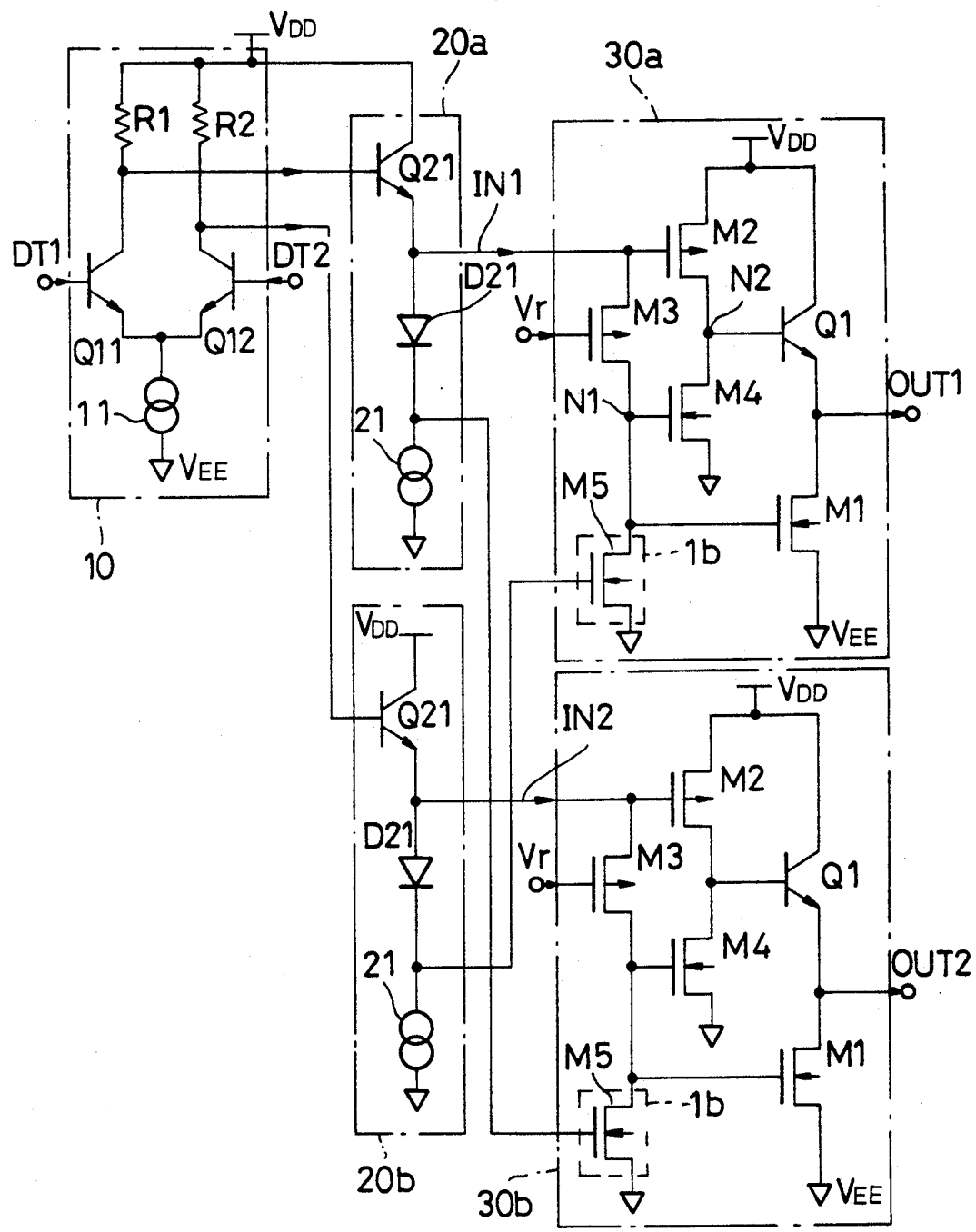
FIG. 7 is a circuit diagram of an embodiment of another level converter according to the present invention.

The level converter shown in FIG. 7 is effective in handling signals having levels in complementary relationship. The level converter comprises ECL circuit 10 identical to that shown in FIG. 1, a pair of emitter followers 20a, 20b each having level shifting diode D21 in addition to the components shown in FIG. 1, and a pair of level converting circuits 30a, 30b each similar to the level converting circuit shown in FIG. 4. However, the gates of fifth MIS transistors M5 of level converting circuits 30a, 30b are supplied with voltages from emitter followers 20b, 20a, respectively, which voltages are lower than the potential levels of input signals IN1, IN2 by the forward voltage of diodes D21.

The levels of input signals IN1, IN2 are shifted by diodes D21 of emitter followers 20a, 20b when input signals IN1, IN2 are supplied to the gates of MIS transistors M5 of the level converting circuits 30a, 30b. Therefore, when the levels of input signals IN1, IN2 are low, MIS transistors M5 are completely turned off. While level converting circuits 30a, 30b shown in FIG. 7 are functionally identical to the level converting circuit shown in FIG. 4, the time delay that the input signals suffer is shorter than with the gates of MIS transistors M5 being connected to nodes N2.

Discharge circuit 1 shown in FIG. 5 may be replaced by fifth MIS transistor M5. MIS transistor M5 shown in FIG. 6 may be replaced by discharge circuit 1. First MIS transistor M1 shown in FIGS. 6 and 7 may be replaced with second bipolar transistor Q2.

With the present invention, the conventional drivers are incorporated in the respective level converting circuits, thus reducing the number of transistor stages ranging from the input to output terminals. Accordingly, the time delay which the input signal undergoes is shortened and the steady current is eliminated, with the result that current consumption can be reduced.

Although certain preferred embodiments of the present invention have been shown and described in detail, it should be understood that various changes and modifications may be made therein without departing from the scope of the appended claims.

What is claimed is:

1. A level converter comprising an ECL circuit having at least one output terminal, an emitter follower connected to the output terminal of said ECL circuit, and a level converting circuit connected to said emitter follower, for converting the logic level of an output signal from said ECL circuit into the logic level of a MIS or BiMIS output signal, the improvement being that said level converting circuit comprises:

an NPN first bipolar transistor having a collector connected to a power supply and an emitter connected to an output terminal of said level converter;

an N-type first MIS transistor having a drain connected to said output terminal and a source connected to a reference potential supply;

a P-type second MIS transistor having a source connected to said power supply, a drain connected to the base of said first bipolar transistor, and a gate connected to an input terminal supplied with an input signal from said emitter follower;

a P-type third MIS transistor having a source connected to the gate of said second MIS transistor, a drain connected to the gate of said first MIS transistor, and a gate connected to a terminal supplied with a control potential supply;

an N-type fourth MIS transistor having a source connected to said reference potential supply, a drain connected to the base of said first bipolar transistor, and a gate connected to the drain of said third MIS transistor; and a discharge circuit having a first terminal connected to the gate of said first MIS transistor and a second terminal connected to said reference potential supply.

2. A level converter according to claim 1, wherein said discharge circuit comprises a resistor having a predetermined resistance.

3. A level converter according to claim 1, wherein said discharge circuit comprises an N-type fifth MIS transistor having a drain connected to the gate of said first MIS transistor, a gate connected to the base of said first bipolar transistor, and a source connected to said reference potential supply.

4. A level converter according to any one of claims 1 through 3, wherein said level converting circuit includes, in place of said first MIS transistor, an NPN second bipolar transistor having a collector connected to said output terminal, an emitter connected to said reference potential supply, and a base connected to the drain of said third MIS transistor and to said first terminal of said discharge circuit.

5. A level converter according to any one of claims 1 through 3, wherein said control potential supply is so selected that when the input signal from said emitter follower is low in level, said third MIS transistor is turned off.

6. A level converter according to any one of claims 1 through 4, wherein said level converting circuit includes, in place of said third MIS transistor, a diode having an anode connected to the gates of said first and fourth MIS transistors and a cathode connected to the gate of said first MIS transistor and to said first terminal of said discharge circuit.

7. A level converter comprising an ECL circuit having two output terminals, a pair of emitter followers each connected to one of said output terminals of the ECL circuit, and a pair of level converting circuits each connected to one of said emitter followers, for converting the complementary logic levels of output signals from said ECL circuit into the logic levels of either MIS or BiMIS output signals, the improvement being that each of said emitter followers comprises:

an NPN bipolar transistor having a collector connected to a power supply, a base connected to one of the output terminals of said ECL circuit, and an emitter connected to one of said level converting circuits, a diode having an anode connected to the emitter of said NPN bipolar transistor, and a constant-current supply connected between the cathode of said diode and a reference potential supply; and each of said level converting circuits comprises:

an NPN first bipolar transistor having a collector connected to said power supply and an emitter connected to an output terminal of said level converter;

an N-type first MIS transistor having a drain connected to said output terminal and a source connected to said reference potential supply;

a P-type second MIS transistor having a source connected to said power supply, a drain connected to the base of said first bipolar transistor, and a gate connected to an input terminal supplied with an input signal from said emitter follower;

a P-type third MIS transistor having a source connected to the gate of said second MIS transistor, a drain connected to the gate of said first MIS transistor, and a gate connected to a terminal supplied with a control potential supply;

an N-type fourth MIS transistor having a source connected to said reference potential supply, a drain connected to the base of said first bipolar transistor, and a gate connected to the drain of said third MIS transistor; and an N-type fifth MIS transistor having a drain connected to the gate of said first MIS transistor, a gate connected to the cathode of the diode of the other emitter follower which is not connected to either level converting circuit, and a source connected to said reference potential supply.

8. A level converter according to claim 7, wherein each of said level converting circuits includes, in place of said first MIS transistor, an NPN second bipolar transistor having a collector connected to said output terminal, an emitter connected to said reference potential supply, and a base connected to the drains of said third and fifth MIS transistors.

* * * * *